(12) United States Patent
Nagarajan et al.

(10) Patent No.: US 8,258,013 B1
(45) Date of Patent: Sep. 4, 2012

(54) INTEGRATED CIRCUIT ASSEMBLY HAVING VENTED HEAT-SPREADER

(75) Inventors: Kumar Nagarajan, San Jose, CA (US); S. Gabriel R. Dosdos, San Jose, CA (US); Dong W. Kim, San Jose, CA (US); Kong W. Lee, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 268 days.

(21) Appl. No.: 12/705,441

(22) Filed: Feb. 12, 2010

(51) Int. Cl.
*H01L 23/10* (2006.01)
*H01L 21/00* (2006.01)

(52) U.S. Cl. ......... 438/115; 257/678; 257/704; 438/106

(58) Field of Classification Search .................. 257/704, 257/678; 438/106, 115
See application file for complete search history.

(56) References Cited

U.S. PATENT DOCUMENTS

| | | | |
|---|---|---|---|
| 6,232,652 B1 * | 5/2001 | Matsushima | 257/667 |
| 6,413,474 B1 * | 7/2002 | Igel et al. | 422/82.05 |
| 7,187,077 B1 * | 3/2007 | Nagarajan | 257/730 |
| 2003/0056392 A1 * | 3/2003 | Boroson et al. | 34/335 |
| 2006/0076695 A1 * | 4/2006 | Hsieh et al. | 257/787 |
| 2006/0118925 A1 * | 6/2006 | Macris et al. | 257/667 |
| 2007/0045819 A1 * | 3/2007 | Edwards et al. | 257/704 |
| 2007/0284704 A1 * | 12/2007 | Leal et al. | 257/666 |

* cited by examiner

*Primary Examiner* — N Drew Richards
*Assistant Examiner* — Peter Bradford
(74) *Attorney, Agent, or Firm* — LeRoy D. Maunu

(57) ABSTRACT

An integrated circuit package assembly includes a substrate, a semiconductor die having opposing first and second surfaces, and a head-spreader. The semiconductor die is mounted on the substrate with the first surface facing the substrate. The heat-spreader includes a central region thermally coupled to the second surface of the semiconductor die, a flange region mounted on the substrate, and a side wall region between the central and flange regions. A cavity is formed between the heat-spreader, the substrate, and the semiconductor die. The heat-spreader has at least one vent extending from the cavity through the heat-spreader.

11 Claims, 10 Drawing Sheets

INTEGRATED CIRCUIT ASSEMBLY HAVING VENTED HEAT-SPREADER

FIELD OF THE INVENTION

One or more embodiments of the present invention generally relates to packaging for integrated circuits.

BACKGROUND

Semiconductor integrated circuits ("ICs") are encapsulated in a variety of difference packages. ICs may be wire-bonded to a frame and encapsulated in molding compound to form a dual in-line package ("DIP") ICs. However, the molding compound used in DIP packaging generally does not have high thermal conduction. As a result, DIP packages may not be suitable for many ICs, which require a high level of heat dissipation. Metal-ceramic packages provide superior heat conduction, but are complex and relatively expensive due to the various metal-ceramic interfaces in the package.

Another IC package provides good thermal performance by thermally coupling a molded metal lid, otherwise known as a heat-spreader, to the side of the IC that is not electrically connected to a substrate. This package is otherwise known as a flip-chip. The IC of a flip-chip package is typically coupled to the substrate with a ball-grid array ("BGA"). BGAs use solder bumps on the front side of the IC, rather than bond wires, to electrically couple the IC to the package substrate. The flip-chip package substrate often has another set of solder bumps on the bottom of the substrate that connect to an array of contacts on a printed circuit board assembly.

When the IC with the heat-spreader is electrically coupled to the substrate BGA, the heat-spreader is affixed to the substrate. The heat-spreader generally includes sidewalls that form an enclosure around the IC and provide an enclosed space for other components such as chip capacitors and resistors, once the heat-spreader is attached to the perimeter of the package substrate with adhesive.

Electronic components are generally coupled to the printed circuit boards with solder. Solder attachment is a high-temperature process that causes out-gassing from the components during solder attachment. Out-gassing from the components can also occur slowly during storage and usage of electronic circuits. In the context of flip-chip packages, gasses generated during out-gassing must be allowed to escape the enclosed package to avoid separation of the heat-spreader from the printed circuit board and chip. In current flip chip package assembly, the heat-spreader is attached to the substrate using adhesive with a gap in the adhesive to allow gas expansion to escape the space enclosed by the heat-spreader.

Chemical fluxes are often used during the soldering processes to ensure that the solder robustly attaches the components to the printed circuit board. A cleaning step is generally included in the assembly process to remove the residue of the chemical fluxes with a corrosive solvent. The corrosive solvent can enter the flip-chip package through the adhesive gap and eventually corrode the components inside the flip-chip package unless the cleaning step removes all traces of the corrosive solvent. However, it is difficult to fully remove any corrosive solvent from within the space enclosed by the heat-spreader.

The present invention may address one or more of the above issues.

SUMMARY

One or more embodiments of the invention provide an integrated circuit package assembly with a vented heat-spreader. In one embodiment, the integrated circuit package assembly includes a substrate, a semiconductor die having opposing first and second surfaces, and a head-spreader. The semiconductor die is mounted on the substrate with the first surface facing the substrate. The heat-spreader includes a central region thermally coupled to the second surface of the semiconductor die, a flange region mounted on the substrate, and a side wall region between the central and flange regions. A cavity is formed between the heat-spreader, the substrate, and the semiconductor die. The heat-spreader has least one vent extending from the cavity through the heat-spreader.

In another embodiment, a method is provided for assembling an electronic circuit. The method includes mounting a first surface of a semiconductor die to a first surface of a substrate. An underfill encapsulation material is placed in gaps between the semiconductor die and the substrate. A vent is formed in a heat-spreader. The heat-spreader includes a central region, a flange region, and a sidewall region between the central and flange regions. A central region of a heat-spreader is thermally coupled to a second surface of the semiconductor die. The second surface of the semiconductor die is opposite the first surface. The flange region of the heat-spreader is mounted to the substrate, creating a cavity between the heat-spreader, the substrate, and the semiconductor die.

An integrated circuit, in another embodiment, includes means for electrically coupling a substrate and a first surface of a semiconductor die. The first surface and a second surface of the semiconductor die are opposing surfaces of the semiconductor die. Means are provided for thermally coupling a central region of a heat-spreader and the second surface of the semiconductor die. The heat-spreader includes the central region, a flange region, a side wall region that is between the central and flange regions, and at least one vent hole. Means are provided for mounting the flange region of the heat-spreader to the substrate. A sloping of the side wall region relative to the central and flange regions produces a cavity between the heat-spreader and the substrate, the cavity including the semiconductor die. The mounting of the flange region forms a liquid tight seal between the flange region and the substrate. The integrated circuit further includes means for forming a seal over the vent hole.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIGS. 1-2 shows a package assembly with a vented heat-spreader having vertical sidewalls and an outward flange;

FIGS. 1-3 shows a package assembly with a vented heat-spreader having vertical sidewalls and an inward flange;

FIG. 2 shows a top-level view of a package assembly in accordance with an embodiment of the invention;

FIGS. 3-1 shows a partial cross-sectional view of a heat-spreader having a vent that is sealed with adhesive tape on the exterior of the heat-spreader;

FIGS. 3-2 shows a partial cross-sectional view of a heat-spreader having a vent that is sealed by a membrane, which may be formed on the interior and the exterior of the heat-spreader;

FIGS. 4-1 shows a partial cross-sectional view of a heat-spreader having vent placement in the center and flange regions of the heat-spreader;

FIGS. 4-2 shows a partial cross-sectional view of a heat-spreader having vent placement located on the border of the center and sidewall regions, and on the border of the sidewall and flange regions;

FIGS. 6-1, 6-2, 6-3, and 6-4 show a partial cross section of heat-spreader illustrating several example vent-duct configurations;

DETAILED DESCRIPTION OF THE DRAWINGS

In current flip chip package designs, the heat-spreader is attached to the substrate using adhesive with a gap in the adhesive to allow gas expansion to escape the space enclosed by the heat-spreader. However, liquid chemicals used in mounting the package to the printed circuit board may enter the space under the heat-spreader through the gap. These liquids are difficult to remove or clean from the inside of the package. These remaining chemicals can corrode components, such as chip capacitors, inside the space between the heat-spreader, substrate, and chip. One or more embodiments of the present invention provide a semiconductor package with a vented heat-spreader that can prevent liquids from entering the enclosure while allowing expanding gases to escape.

Figure 1:
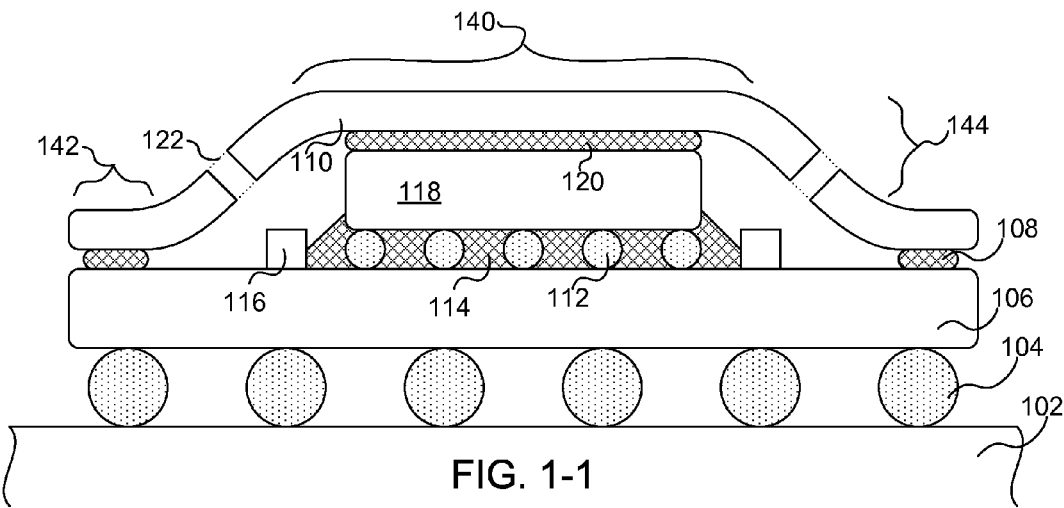
FIGS. 1-1 shows a package assembly with a vented heat-spreader having sloped sidewalls.
Figures 1, 2:
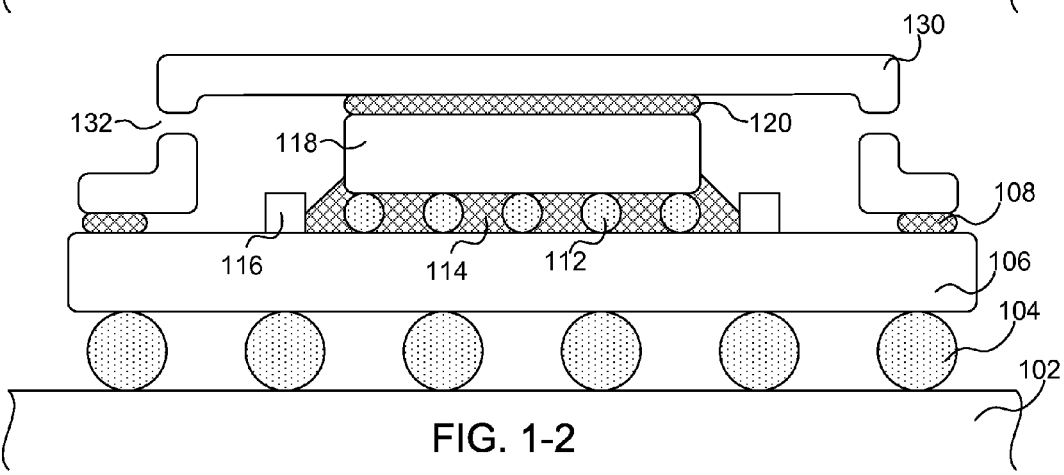
Figures 1, 2, 3:
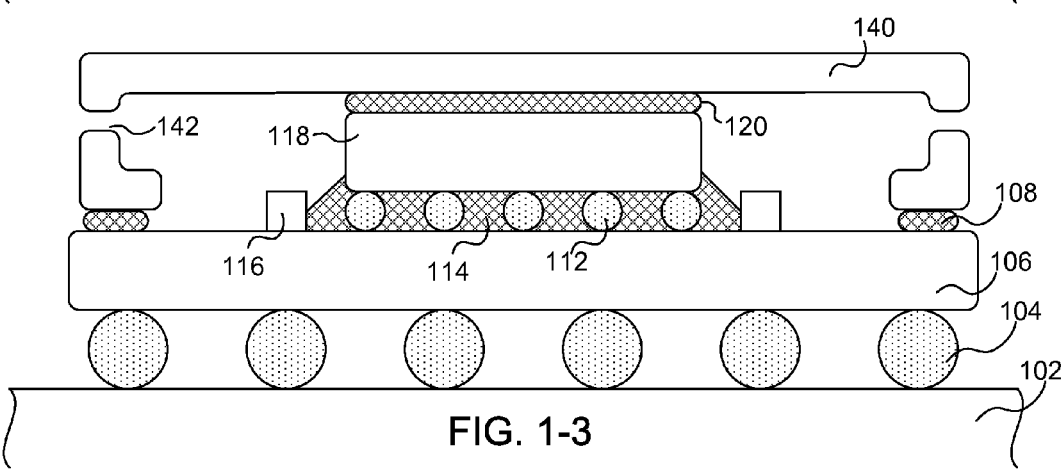
Figure 2:
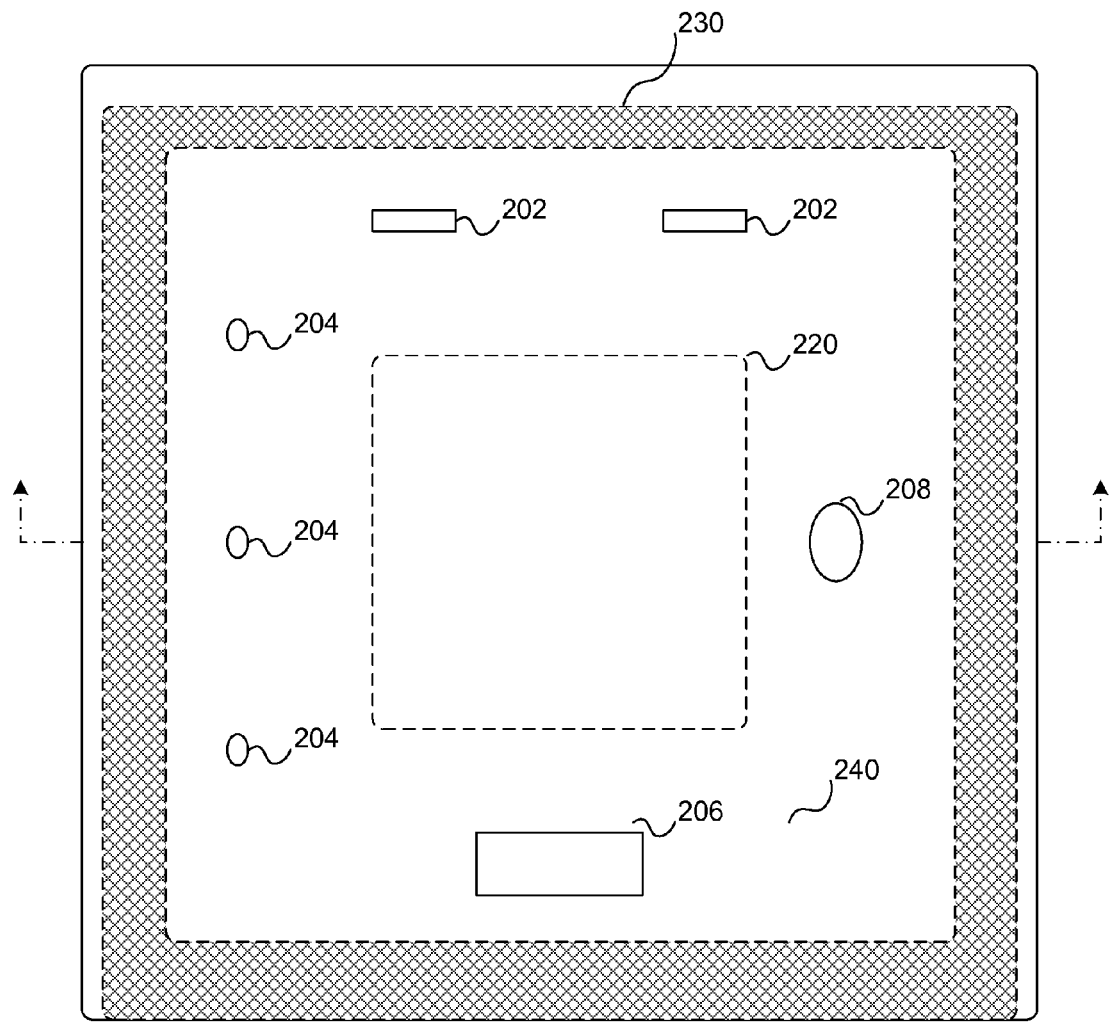
Figures 1, 3:
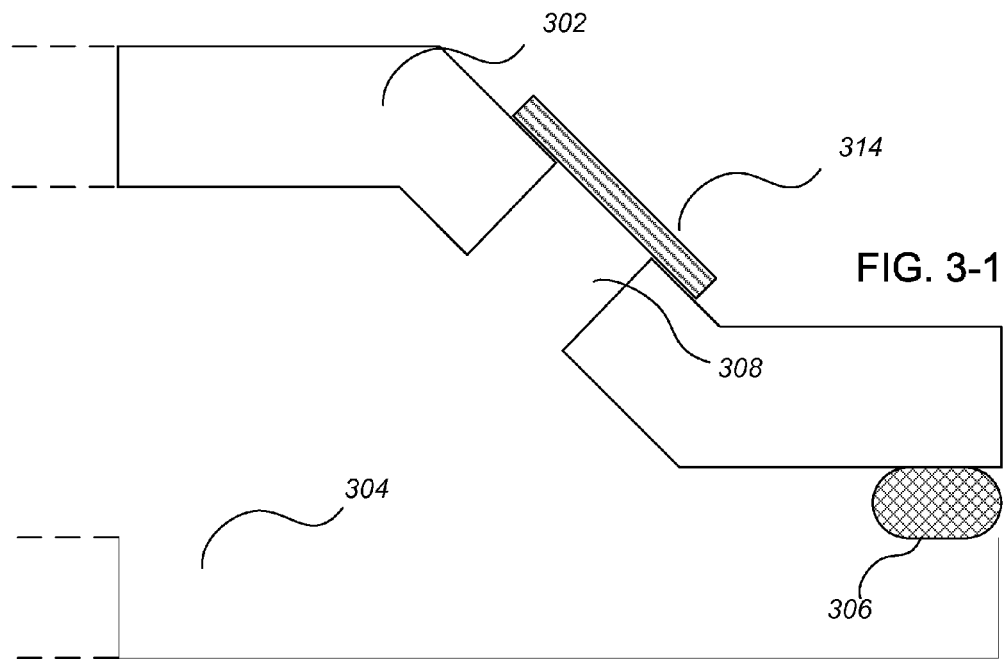
Figures 2, 3:
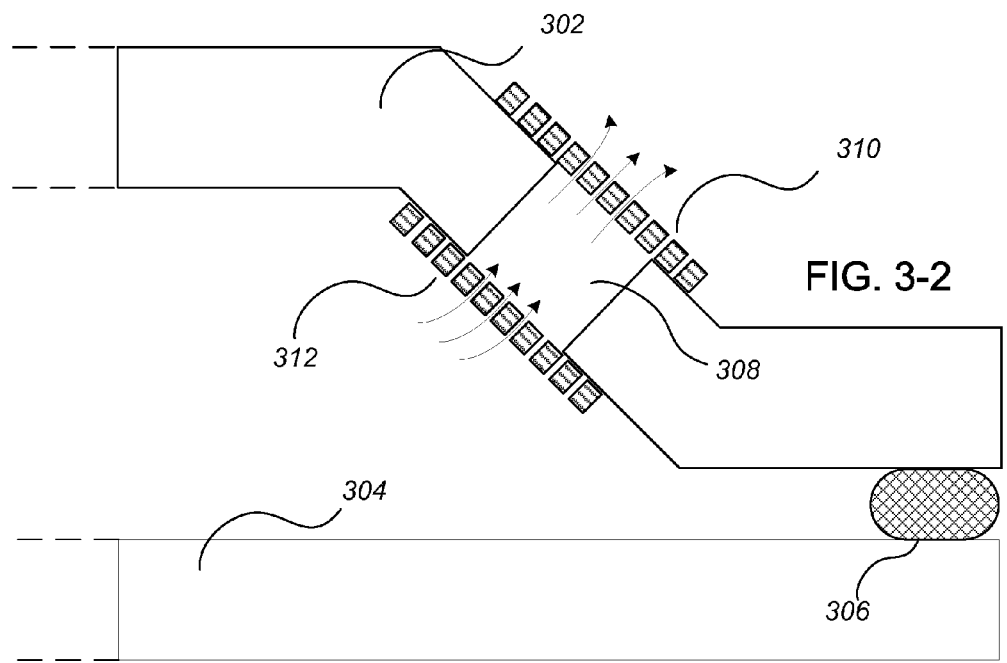

FIGS. 1-1, 1-2, and 1-3 show cross-section views of integrated circuit package assemblies with several heat-spreaders in accordance with an embodiment of the invention. A silicon die 118 is mounted on top of a multi-layer substrate 106 using flip chip solder joint bonding 112. As used within the specification and the claims, the term "on" includes when items (e.g., the die 118 and the substrate 106) are in physical contact and also when the items are separated by one or more intervening items such as, e.g., the flip chip solder joint bonding 112. An epoxy based underfill material 114 is used to fill the gap between the silicon die and the substrate to reduce stress on the solder joint connections between the two materials. The flip chip package may include several passive components 116 such as chip capacitors or resistors around the silicon die. A heat-spreader 110 is attached to the backside of the die using a thermally conductive adhesive 120 for heat dissipation from the silicon. The heat-spreader is attached to the substrate using heat-spreader attach adhesive 108 for warp control. In some embodiments, the heat-spreader attach adhesive is a thermally conductive adhesive to provide thermal dissipation to the board.

The heat-spreader generally includes the following three regions: a central region 140 that couples to the semiconductor die, a flange region 142 that couples to the substrate, and a sidewall region 144 between the central and flange regions. The heat-spreader may be formed into a variety of shapes. FIG. 1-1 shows a semiconductor package with a heat-spreader 110 having sloped sidewall regions with two vents 122 formed in the sidewall regions. FIGS. 1-2 shows a semiconductor package with a heat-spreader 130 having vertical sidewall regions and two vents 132 formed in the sidewall regions. The heat-spreaders illustrated in FIGS. 1-1 and 1-2 include flange regions that extend outward from the silicon die. In some embodiments of the invention, the flange region may extend inward. FIGS. 1-3 shows a package assembly with a vented heat-spreader 140 having vertical sidewalls, two vents 142, and an inward flange.

FIG. 2 shows a top-level view of a package assembly in accordance with an embodiment of the invention. The figure shows heat-spreader center region 220, sidewall 240, and flange regions 230. Several vent configurations are shown in the sidewall region. Single circular vent 208 and rectangular vent 206 are shown in the sidewall region. Alternately, multiple vents may be configured in a region as shown by vent configurations 202 and 204.

In one embodiment of the invention, the heat-spreader includes one or more vents located in an area of the heat-spreader that can be easily sealed and unsealed externally. The gap provided in the adhesive of existing flip chip packages cannot be easily sealed due to its location between the heat-spreader and the substrate. By forming the vent in a smooth flat surface of the heat-spreader, the vent can be easily sealed and unsealed after the package is complete.

FIGS. 3-1 shows a partial cross-sectional view of a heat-spreader having a vent that is sealed with adhesive tape on the exterior of the heat-spreader. A heat-spreader 302 is mounted on substrate 304 with an adhesive 306. The adhesive 306 contains no gaps and forms a seal between the heat-spreader 302 and the substrate 304. A vent 308 is formed in a sidewall region of the heat-spreader 302. An adhesive seal 314, such as pressure sensitive masking tape, can be used to seal the vent when the package is subjected to board level cleaning processes involving liquid solvents. A number of masking tapes may be used to form a seal over the vent including: polyimide tapes such as Kapton® made by DuPont; polyester masking tapes; vinyl masking tapes; and copper foil masking tapes.

The seal can be removed after the cleaning process has completed to allow expanding gases to escape the package enclosure during operation. In some embodiments, the seal may be soluble to allow for easy removal by means of an additional cleaning stage using water or a non-corrosive chemical. In some embodiments the heat-spreader may be shipped with a seal formed over the vent, which can be removed after board, cleaning has completed.

In another embodiment of the invention, the heat-spreader includes one of more vents that are sealed with a membrane. The membrane is permeable by gasses produced in mounting the package to a printed circuit board and in operation of the device but is impermeable by liquids used in cleaning the board. In this manner, solvents are prevented from entering the package assembly.

FIGS. 3-2 shows a partial cross-sectional view of a heat-spreader having a vent that is sealed by a membrane. A heat-spreader 302 is mounted on substrate 304 with an adhesive 306. The adhesive 306 contains no gaps and forms a seal between the heat-spreader 302 and the substrate 304. A vent 308 is formed through the heat-spreader 302. A membrane is placed over the vent to provide a liquid tight seal. In this example, two membranes 310 and 312 are shown. The membrane may be formed on the interior, as shown by 312, the exterior as shown by 310, or on the interior and exterior of the heat-spreader.

Although the examples and embodiments have been described with vents placed in the sidewall region, placement of vents is not limited to the sidewall region.

Figures 1, 4:
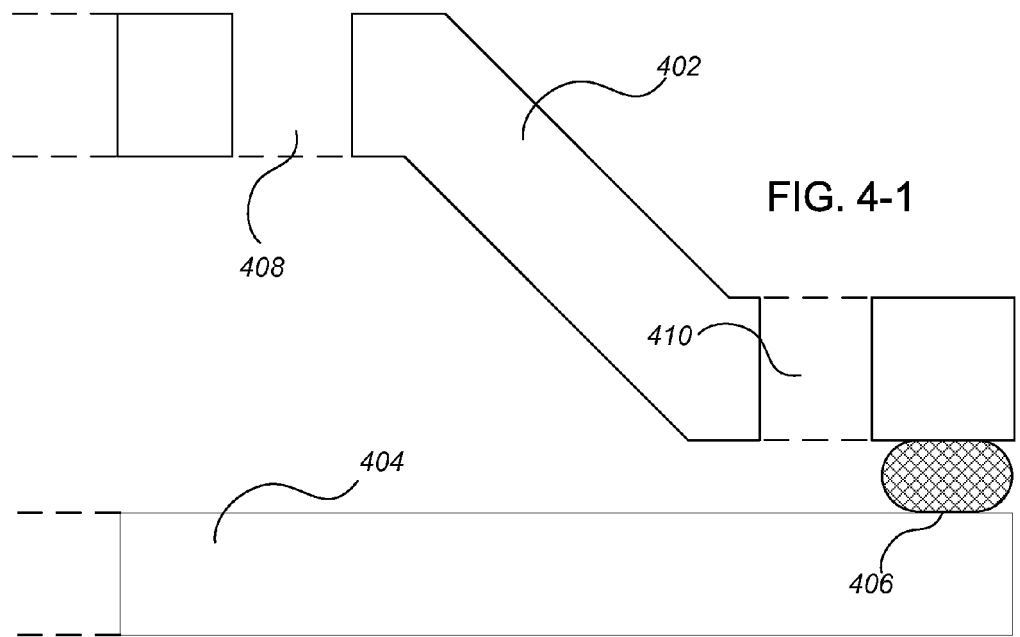
Figures 2, 4:
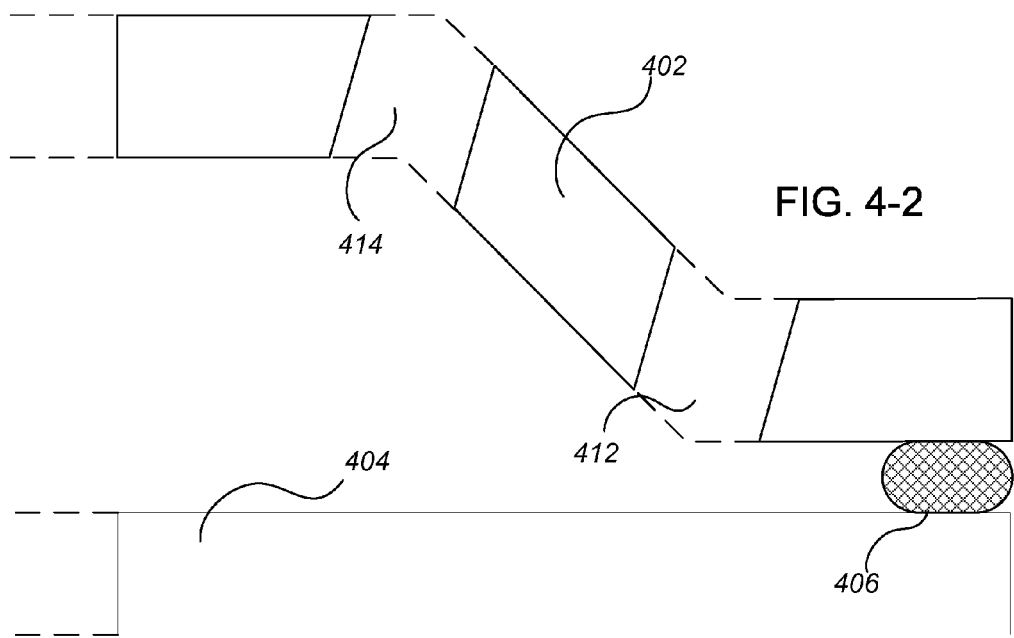

FIGS. 4-1 shows a partial cross-sectional view of a heat-spreader having vent placement outside of the sidewall region of the heat-spreader. A heat-spreader 402 is mounted on substrate 404 with an adhesive 406. In this example, one vent 408 is placed in the center region and one vent 410 is placed in the flange region.

Larger vents may be formed that encompass more than one region. For example, FIGS. 4-2 shows a partial cross-sectional view of a heat-spreader having two vents. A heat-spreader 402 is mounted on substrate 404 with an adhesive 406. One vent 414 is formed in the edge between the center and sidewall regions. Another vent 412 is formed in the edge between the sidewall and flange regions.

In another embodiment of the invention, a vent-duct is formed in the substrate region to connect a vent formed in the flange region to the internal cavity.

Figure 5:
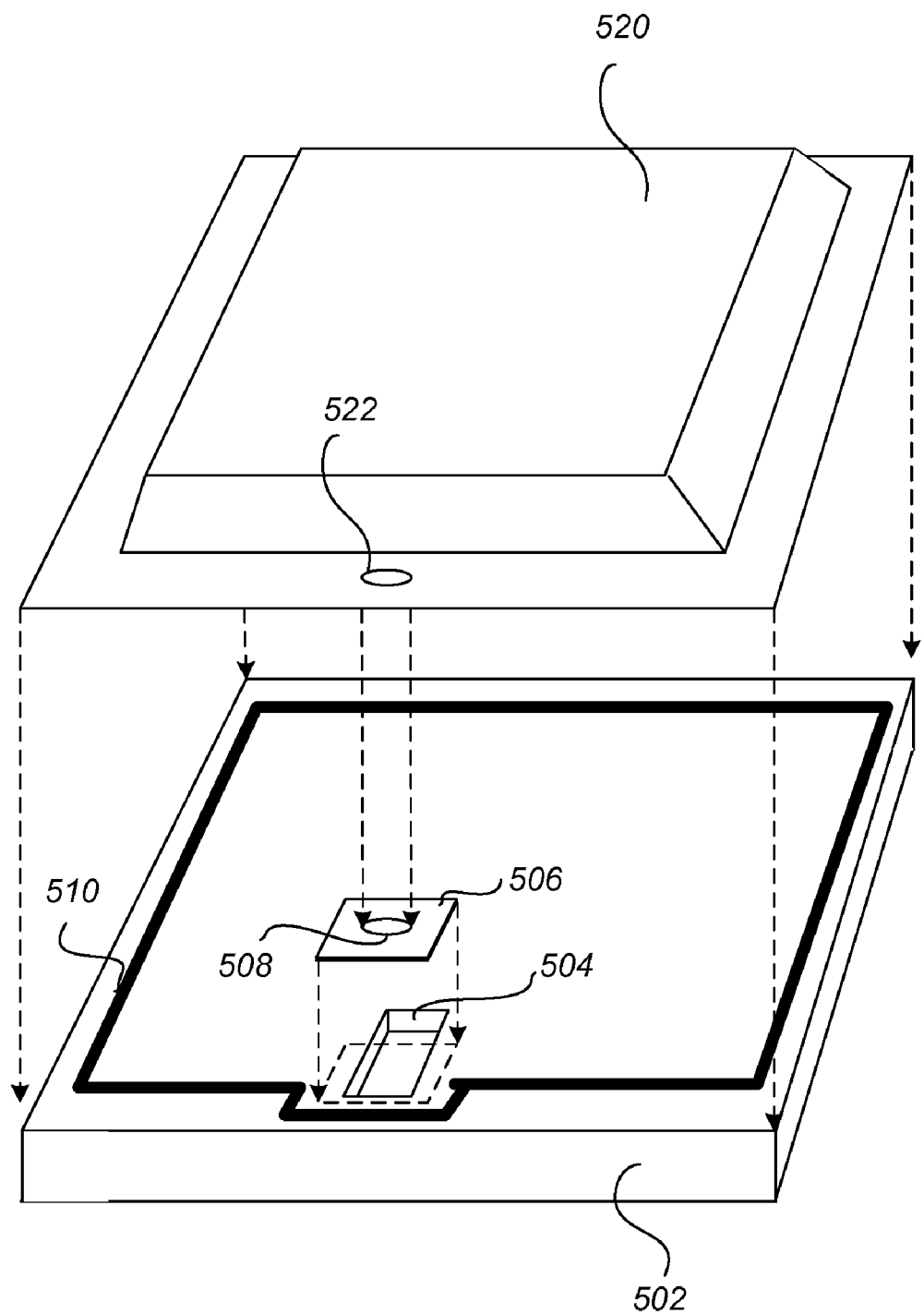
FIG. 5 shows a perspective view of flip chip package having vent-duct formed in the substrate.

FIG. 5 shows a perspective view of flip chip package having vent-duct formed in the substrate. The vent-duct 504 is formed by creating channel in the substrate 502. A cover 506, including a membrane 508 is placed over a portion of the vent-duct 504.

The membrane and channel are placed to align with vent 522 in heat-spreader 520. Adhesive seal 510 is provided to affix and seal the heat-spreader to the substrate.

Figures 1, 6:
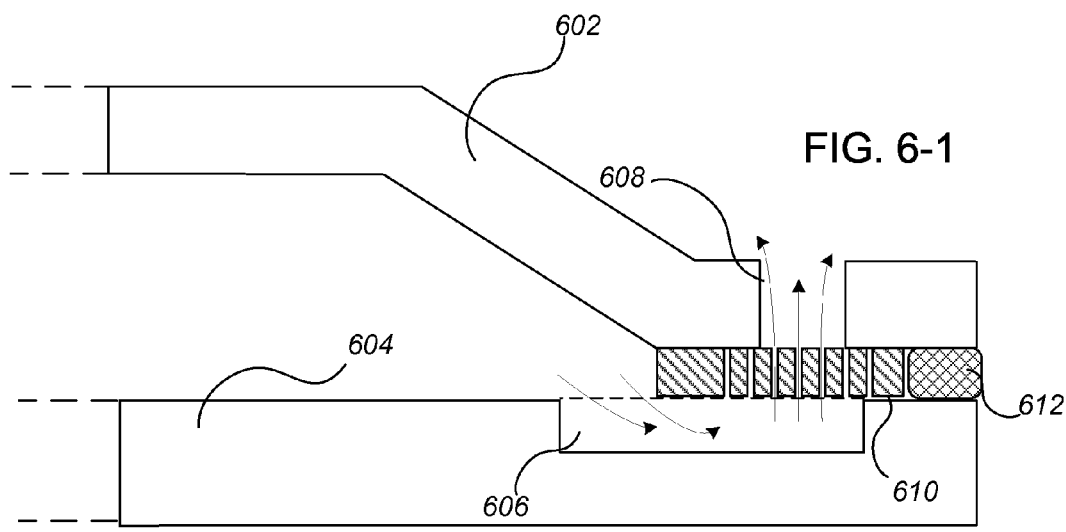
Figures 2, 6:
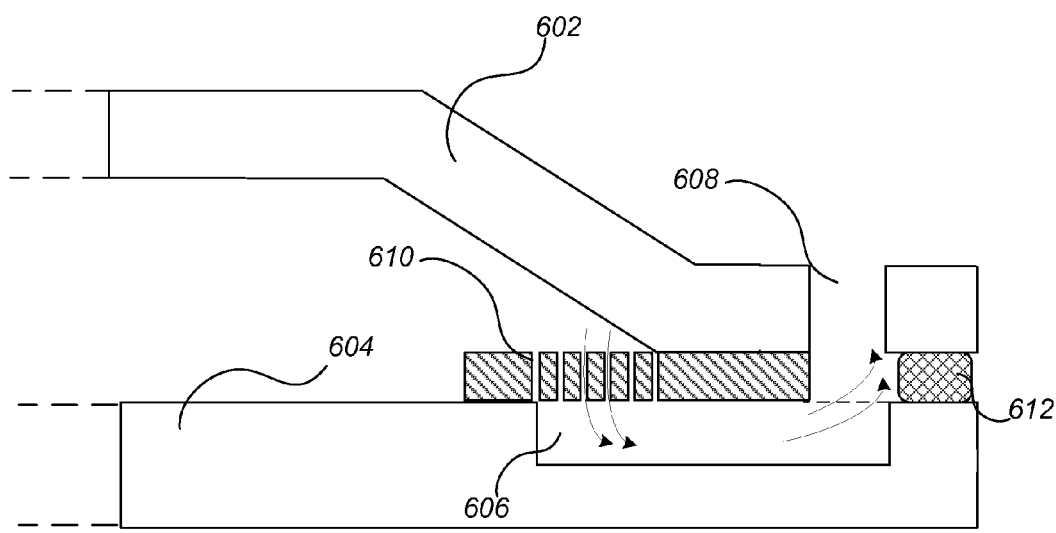
Figures 3, 6:
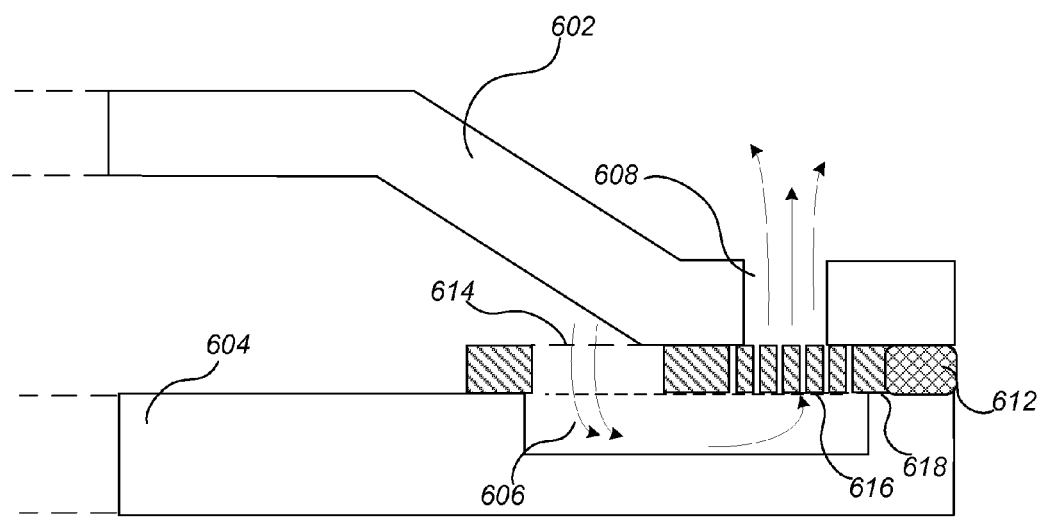
Figures 4, 6:
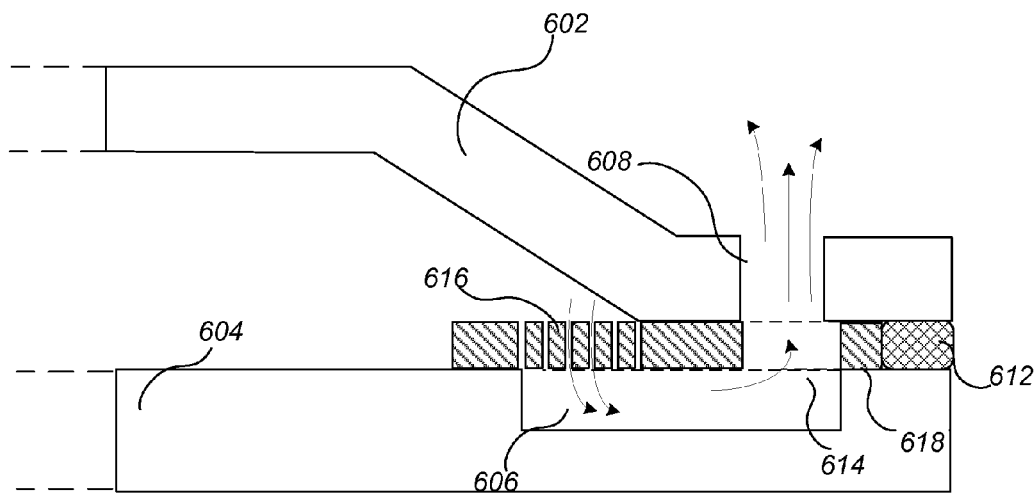

The vent-duct can be combined with a membrane or pressure-sensitive tape in a number of configurations. FIGS. 6-1, 6-2, 6-3, and 6-4 show partial cross sections of heat-spreaders illustrating several example vent-duct configurations. A heat-spreader 602 is mounted on substrate 604 with an adhesive 612. A vent-duct is formed in substrate 604. FIGS. 6-1 shows a membrane cover 610 placed at the vent end of the vent-duct 606. The membrane cover 610 includes an air permeable membrane formed in a portion of the membrane cover. The membrane cover 610 is placed over an outside portion of vent-duct 606 and aligned under vent 608. FIGS. 6-2 illustrates a second configuration, where the membrane cover 610 is placed at the end of the vent duct adjacent to the cavity formed between the heat-spreader, the substrate, and the semiconductor die.

FIGS. 6-3 and 6-4 show two example configurations, in which the membrane cover 618 includes a membrane vent 614 and a membrane 616. In FIG. 6-3, the membrane 616 is aligned under vent 608 and membrane vent 614 is located at the end of the vent duct adjacent to the cavity. In FIGS. 6-4, the membrane 616 is located at the end of the vent duct adjacent to the cavity and the membrane vent 614 is aligned under vent 608. In these configurations, the membrane forms a seal that allows gas to escape from the cavity but prevents liquids from entering.

Figure 7:
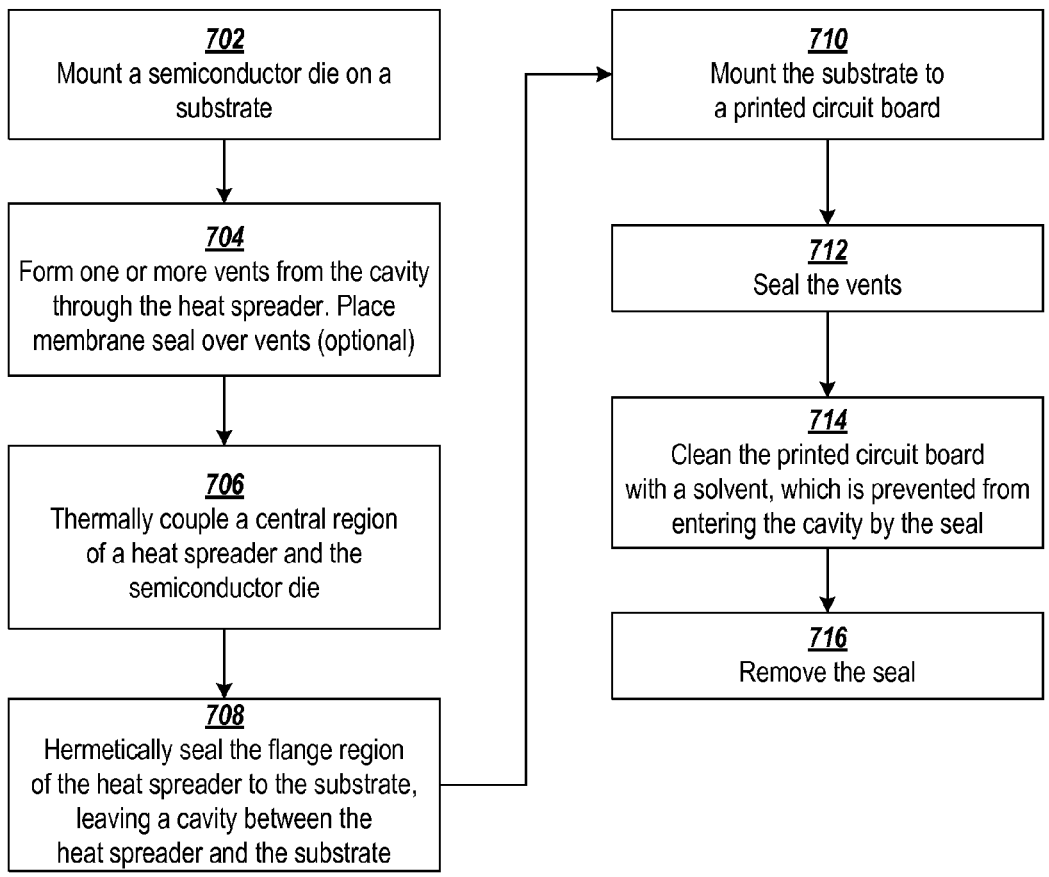
FIG. 7 is flow diagram of a process for assembling an electronic circuit in accordance with an embodiment of the invention.

FIG. 7 is flow diagram of a process for assembling an electronic circuit in accordance with an embodiment of the invention. A semiconductor die is mounted on a substrate at step 702. One or more vents are formed from the cavity through a heat-spreader at step 704. Membranes are also placed over the vents to form seals if membranes are used. A central region of a heat-spreader is thermally coupled to the semiconductor die at step 706. The flange region of the heat-spreader is hermetically sealed to the substrate, forming a cavity between the heat-spreader and the substrate at step 708. The substrate is mounted to a printed circuit board at step 710. If the membranes seals were not formed over vents in step 704, the vents are sealed at step 712. The printed circuit board is cleaned with a solvent at step 714. The solvent is prevented from entering the cavity by the seal. The seal is removed at step 716.

The membrane may be formed from a number of permeable materials. However, non-permeable materials may also be used to create a suitable membrane. For example, in one implementation, a membrane may be formed from a silicone rubber by punching one or more small holes through the silicone rubber.

Figure 8:
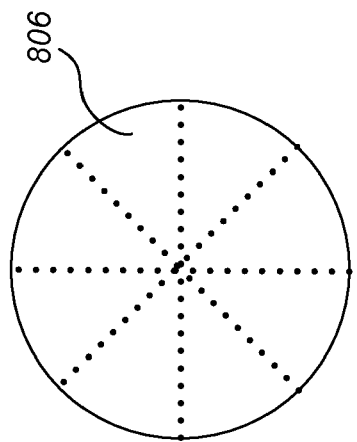
FIG. 8 shows several hole patterns for membrane implementations which may be used in accordance with an embodiment of the invention.
Figure 8:
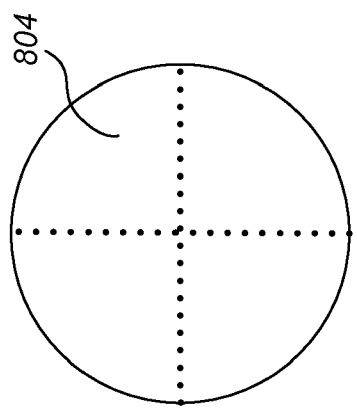
Figure 8:
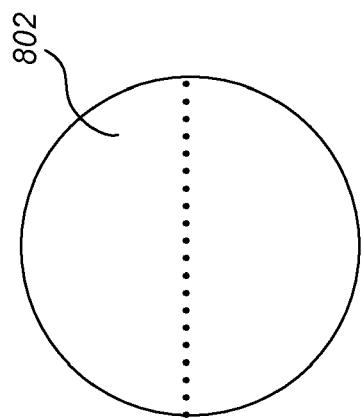

FIG. 8 shows several hole patterns for membrane implementations, which may be used in accordance with an embodiment of the invention. Membrane pattern 802 includes several holes punched though the membrane material in a line. Membrane pattern 804 includes several holes punched though the membrane material in two lines. Membrane 806 includes several holes punched though the membrane material in three lines. The permeability of the membrane can be controlled by adjusting the number and size of the holes.

Figure 9:
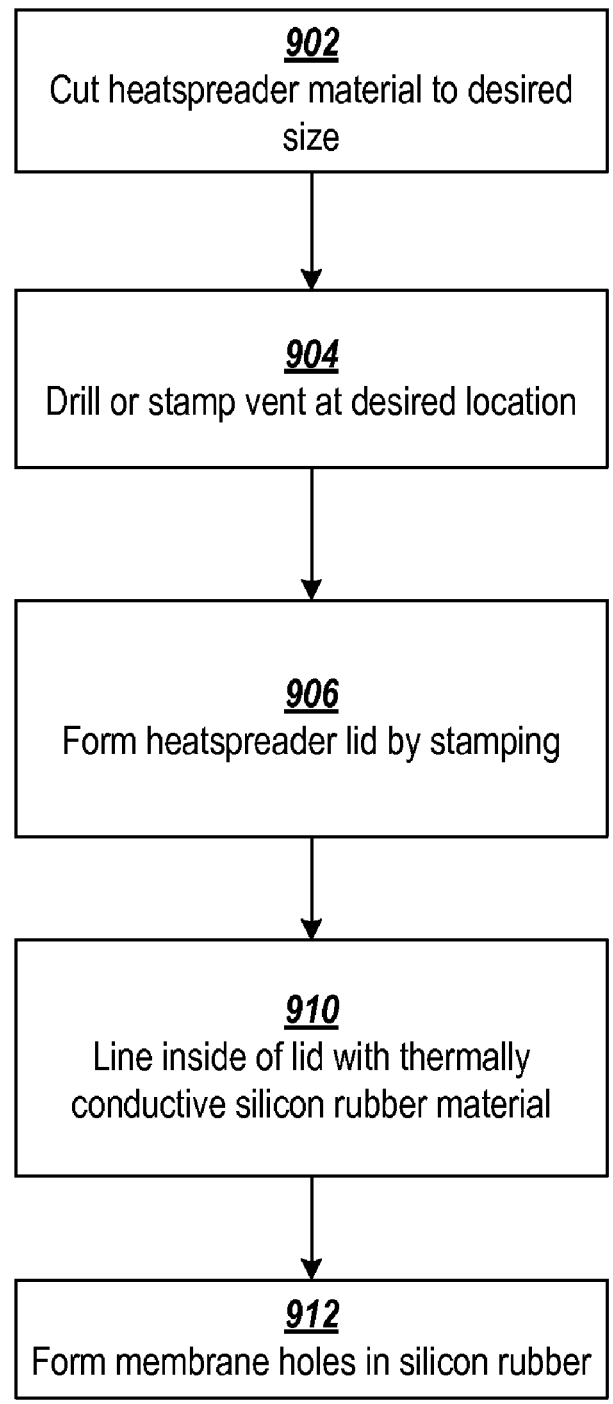
FIG. 9 shows a flowchart of an example process for forming a vented heat-spreader with membrane seal in accordance with an embodiment of the invention.

FIG. 9 shows a flowchart of an example process for forming a vented heat-spreader with membrane seal in accordance with an embodiment of the invention. Heat-spreader material is cut to a desired size at step 902. The heat-spreader can be formed from a number of thermally conductive materials. Nickel-plated copper is one common material used to implement heat-spreaders. A vent is drilled or stamped in the heat-spreader at a desired location at step 904. The heat-spreader is formed into a desired shape having a center, sidewall, and flange regions through a stamping process at step 906. The inside of the heat-spreader is lined with a thermally conductive silicone rubber material at step 910. Membrane holes and formed in the silicone rubber at the location of the vent at step 912.

The present invention is thought to be applicable to a variety of integrated circuit packages. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit package assembly, comprising:
    a substrate;
    a semiconductor die having opposing first and second surfaces and mounted on the substrate with the first surface facing the substrate;
    a heat-spreader including:
        a central region thermally coupled to the second surface of the semiconductor die;
        a flange region mounted on the substrate;
        a sidewall region between the central and flange regions, wherein a cavity is formed between the heat-spreader, the substrate, and the semiconductor die; and
        at least one vent located in the flange region of the heat-spreader;
    a duct formed in the substrate, wherein the duct has a first end at the least one vent and extends to a second end at the cavity; and
    a membrane disposed at one of the first or second ends of the duct, wherein the membrane allows gaseous matter to flow from the cavity through the vent and prevents liquid from flowing through the vent and into the cavity.

2. The package assembly of claim 1, wherein the sidewall region is sloped relative to the central and flange regions, and the produces a cavity is between the heat-spreader and the substrate.

3. The package assembly of claim 1, further comprising:
    an array of solder balls for electrically coupling the substrate and the first surface of the semiconductor die; and
    an epoxy underfill coupling the substrate and the semiconductor die.

4. The package assembly of claim 1, further comprising:
a thermally conductive adhesive for coupling the central region of the heat-spreader and the second surface of the semiconductor die; and
a loop of adhesive for forming a hermetic seal between the flange region of the heat-spreader and the substrate.

5. The package assembly of claim 4, wherein the loop of adhesive is thermally conductive.

6. The package assembly of claim 1, further comprising an array of solder balls for electrically and mechanically coupling a printed circuit board to the second surface of the substrate.

7. The package assembly of claim 1, wherein the membrane includes a plurality of holes of a size that allows gaseous matter to pass through the holes and are impermeable by liquids.

8. The package assembly of claim 1, wherein the at least one vent is located in the sidewall region of the heat-spreader.

9. A method of assembling an electronic circuit, comprising:
mounting a first surface of a semiconductor die on a first surface of a substrate;
placing underfill encapsulation material in gaps between the semiconductor die and the substrate;
forming a vent in a flange region of a heat-spreader, the heat-spreader further including a central region and a sidewall region, the sidewall region disposed between the central and flange regions;
forming a duct in the substrate;
placing a membrane at one of the first or second ends of the duct;
thermally coupling a central region of a heat-spreader to a second surface of the semiconductor die, the second surface of the semiconductor die being opposite the first surface; and
mounting the flange region of the heat-spreader to the substrate, a portion of the flange region being mounted over the duct, wherein a cavity is formed between the heat-spreader, the substrate, and the semiconductor die, the duct has a first end at the vent and a second end at the cavity, and the membrane allows gaseous matter to flow from the cavity through the vent and prevents liquid from flowing through the vent and into the cavity.

10. The method of claim 9, further comprising:
electrically and mechanically coupling a second surface of the substrate, opposite the first surface of the substrate, to a printed circuit board; and
cleaning the printed circuit board with a liquid solvent, wherein the liquid tight seal prevents the solvent from entering the cavity through the at least one vent during the cleaning of the printed circuit board.

11. An integrated circuit, comprising:
means for electrically coupling a substrate and a first surface of a semiconductor die, wherein the first surface and a second surface of the semiconductor die are opposing surfaces of the semiconductor die;
means for thermally coupling a central region of a heat-spreader and the second surface of the semiconductor die, wherein the heat-spreader includes the central region, a flange region, a side wall region that is between the central and flange regions, and at least one vent hole located in the flange region;
means for mounting the flange region of the heat-spreader to the substrate, wherein a cavity is formed in an area bounded by the semiconductor die, the heat-spreader, and the substrate, and wherein the mounting of the flange region forms a liquid tight seal between the flange region and the substrate; and
a duct formed in the substrate, wherein the duct has a first end at the least one vent hole and extends to a second end at the cavity;
a membrane disposed at one of the first or second ends of the duct, wherein the membrane allows gaseous matter to flow from the cavity through the vent hole and prevents liquid from flowing through the vent hole and into the cavity.

\* \* \* \* \*